(12) United States Patent
Kweon

(10) Patent No.: US 8,008,755 B2
(45) Date of Patent: Aug. 30, 2011

(54) MOLD FOR FORMING MOLDING MEMBER AND METHOD OF MANUFACTURING LED PACKAGE USING THE SAME

(75) Inventor: Joung Il Kweon, Gyeonggi-do (KR)

(73) Assignee: Samsung Led Co., Ltd., Suwon (KR)

( * ) Notice: Subject to any disclaimer, the term of this patent is extended or adjusted under 35 U.S.C. 154(b) by 230 days.

(21) Appl. No.: 12/076,548

(22) Filed: Mar. 19, 2008

(65) Prior Publication Data
US 2009/0162957 A1 Jun. 25, 2009

(30) Foreign Application Priority Data
Dec. 21, 2007 (KR) .......... 10-2007-0135476

(51) Int. Cl.
*H01L 33/00* (2010.01)
*B29C 43/34* (2006.01)

(52) U.S. Cl. .......... 257/666; 257/E33.056; 438/27; 438/29

(58) Field of Classification Search .......... 257/666, 257/E33.056; 438/26, 27, 29
See application file for complete search history.

(56) References Cited

U.S. PATENT DOCUMENTS

| 2003/0168720 | A1* | 9/2003 | Kamada | 257/666 |
| 2008/0268559 | A1* | 10/2008 | Jung | 438/26 |
| 2009/0162957 | A1* | 6/2009 | Joung | 438/27 |
| 2010/0047941 | A1* | 2/2010 | Lee et al. | 438/27 |
| 2010/0053978 | A1* | 3/2010 | Lee | 362/311.01 |

FOREIGN PATENT DOCUMENTS

| JP | 2007-184310 | 7/2007 |
| KR | 10-2006-0135498 | 12/2006 |
| KR | 10-2007-0008269 | 1/2007 |

OTHER PUBLICATIONS

Korean Notice of Allowance dated Dec. 24, 2009 and issued in corresponding Korean Patent Application 10-2007-0135476.

* cited by examiner

*Primary Examiner* — Fernando L Toledo

(57) ABSTRACT

Provided is a method of manufacturing a light emitting diode (LED) package, the method including the steps of: preparing a package substrate having an LED chip mounted thereon; preparing a mold which has a convex portion, a plane portion extending outward from the convex portion, and a projecting portion formed on the lower surface of the plane portion, the projecting portion having a sharp end; engaging the mold with the package substrate such that the projecting portion is contacted with the surface of the package substrate; and filling transparent resin into the convex portion.

25 Claims, 5 Drawing Sheets

[FIG. 1A]
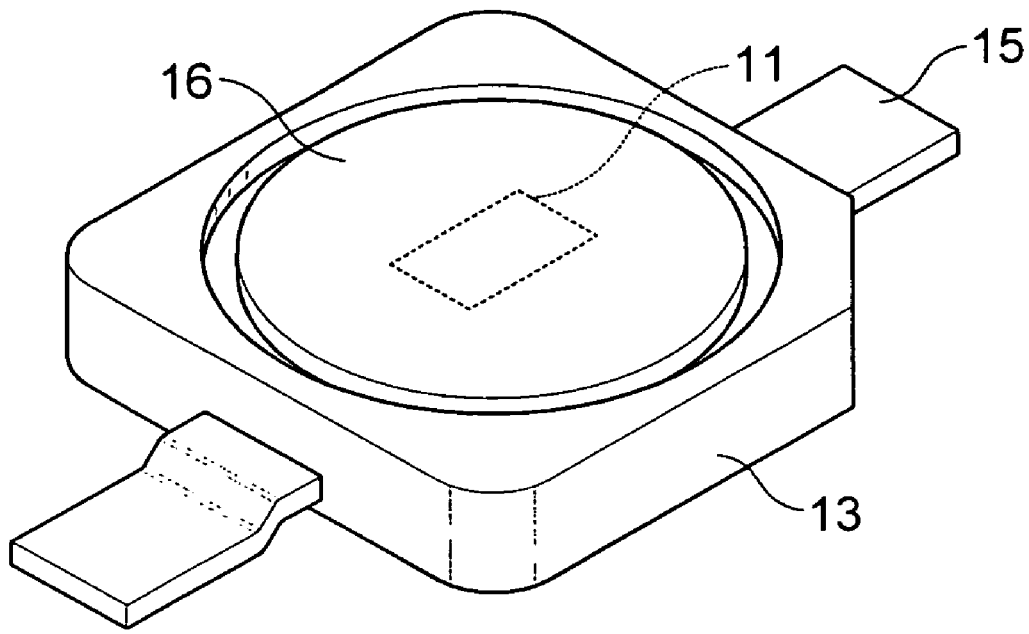
- Prior Art -
[FIG. 1B]
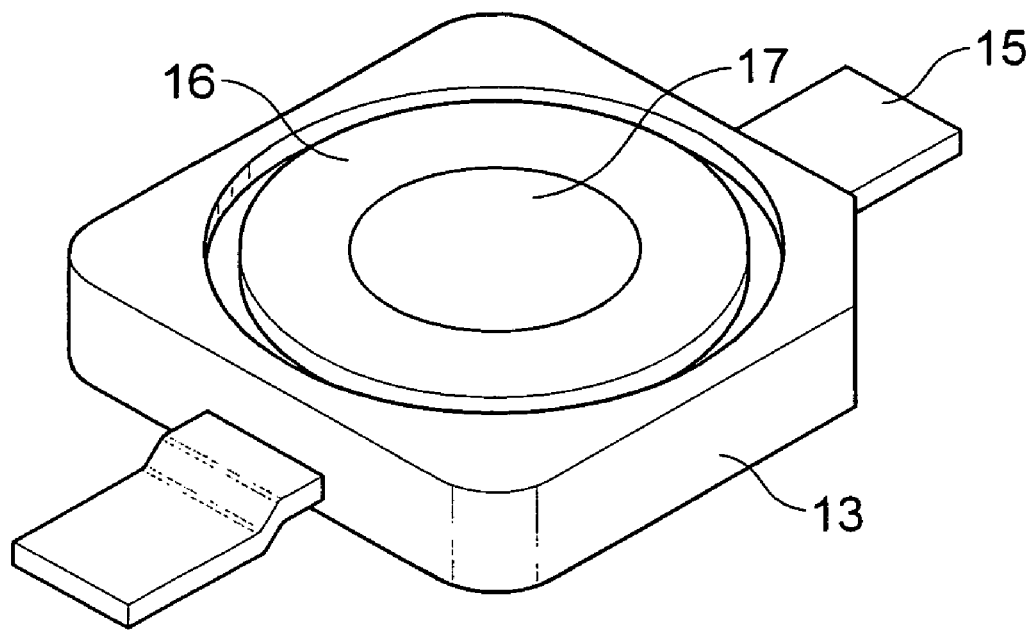
- Prior Art -

[FIG. 1C]
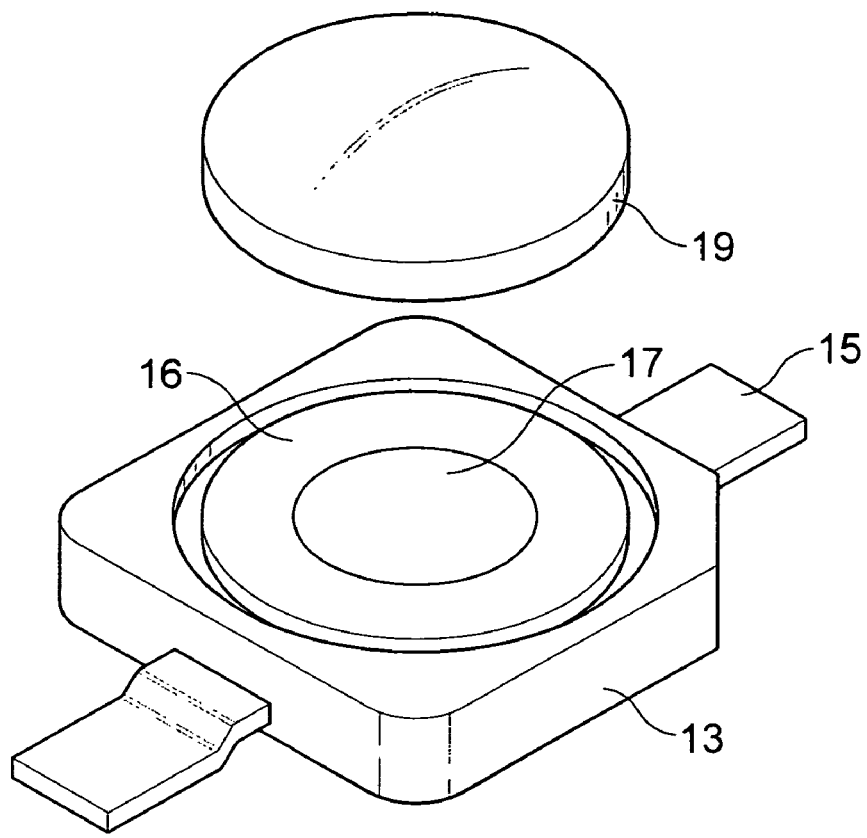
- Prior Art -
[FIG. 1D]
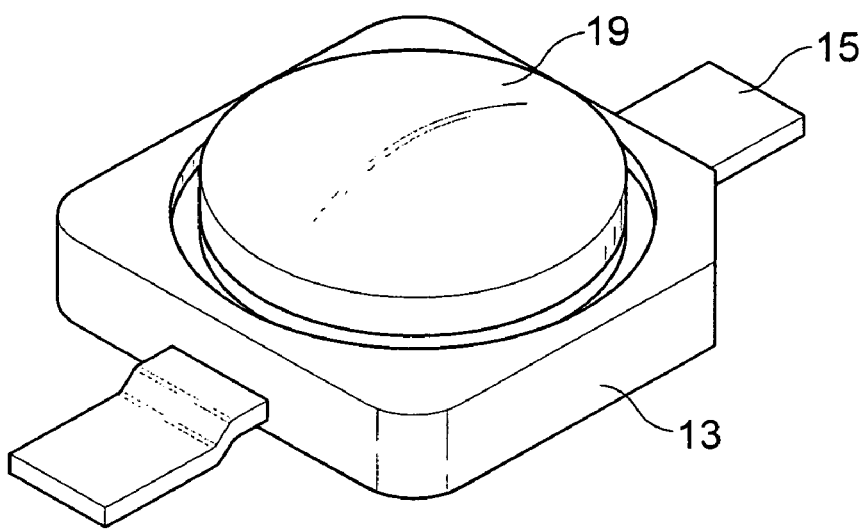
- Prior Art -

[FIG. 2A]
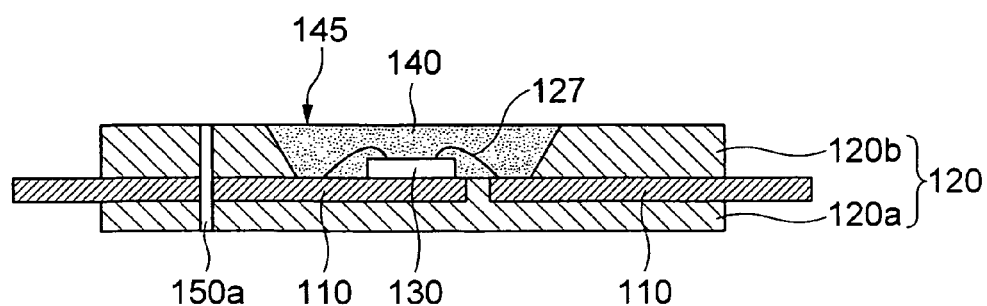
[FIG. 2B]
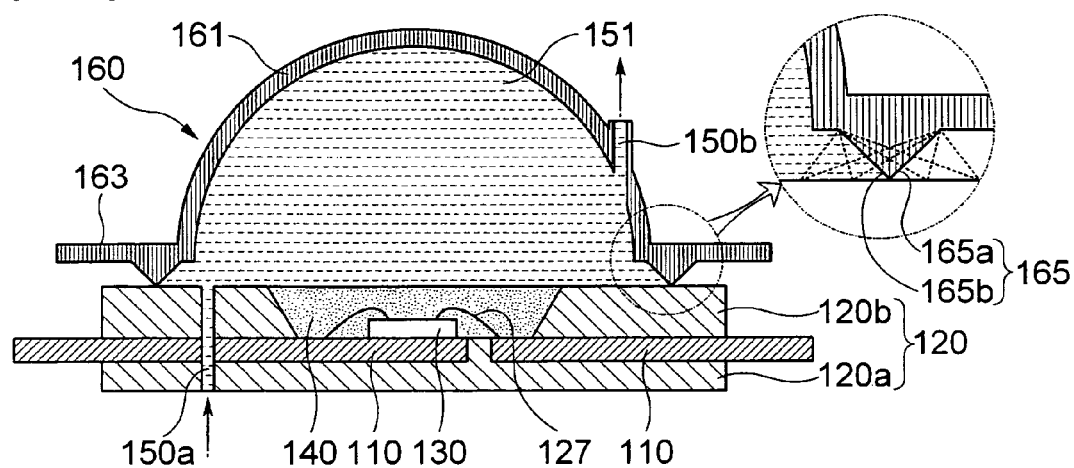

[FIG. 2C]
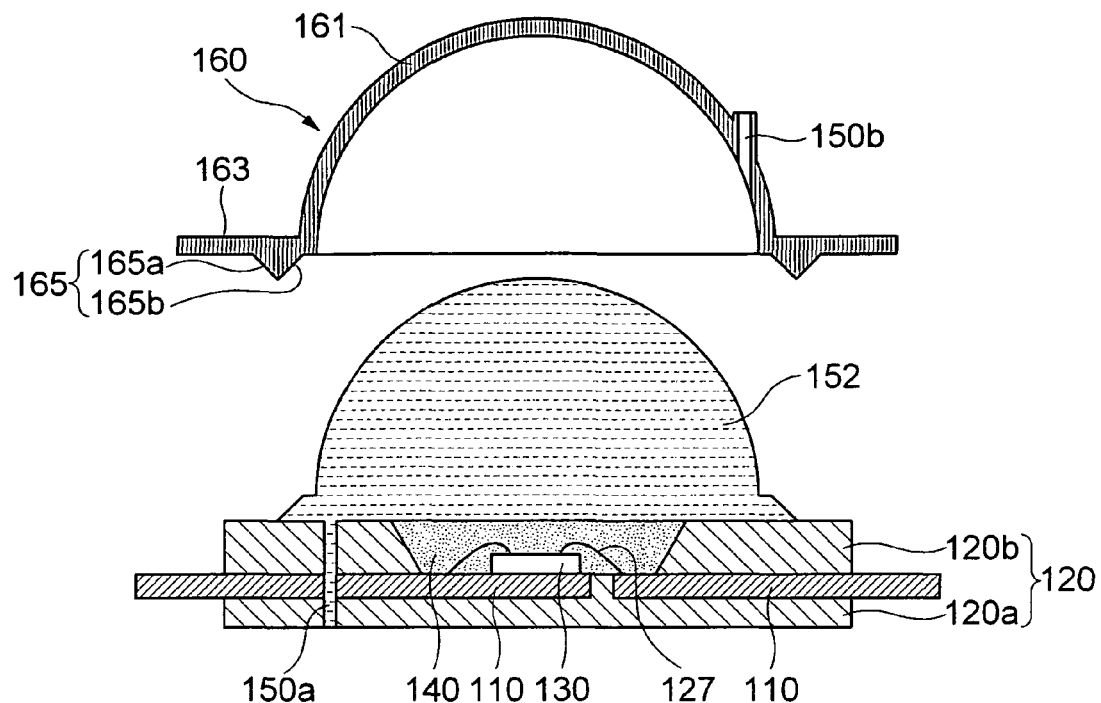
[FIG. 3]
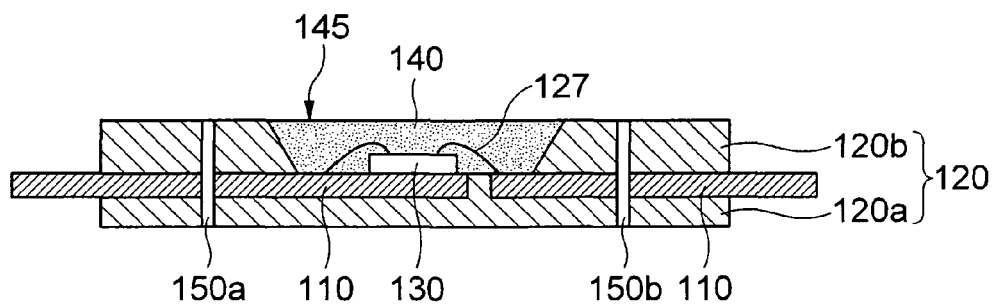
[FIG. 4A]
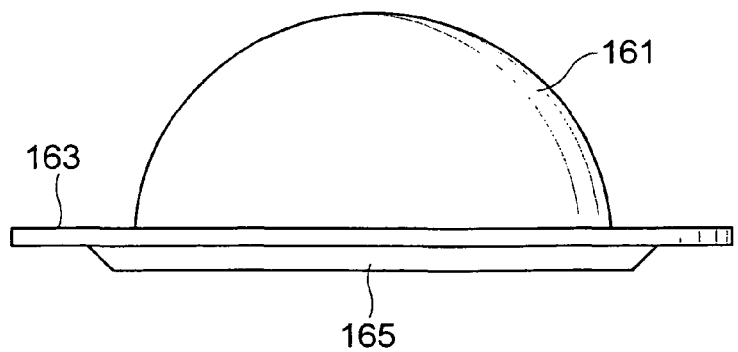

[FIG. 4B]
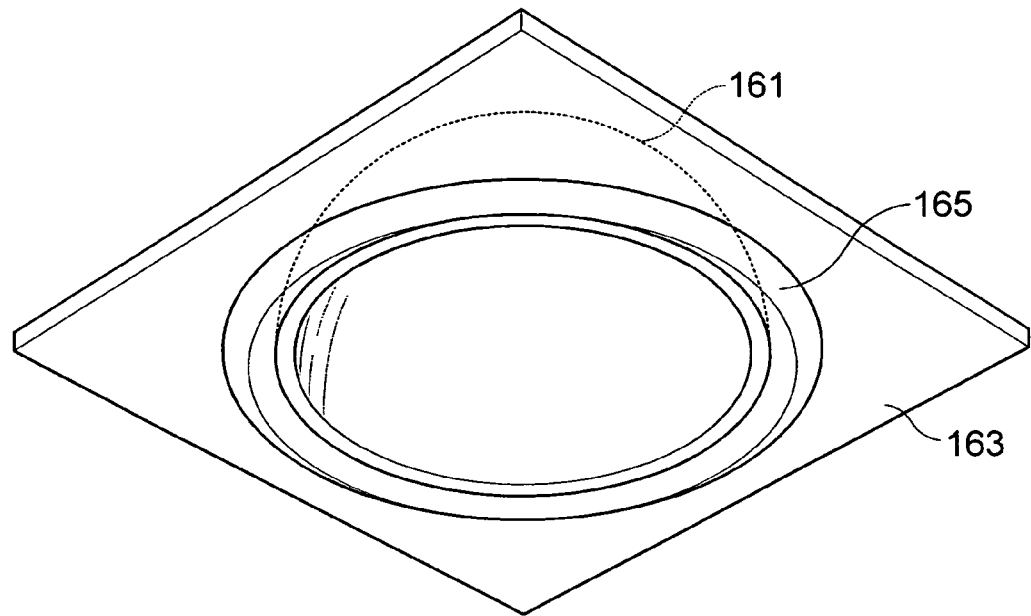
[FIG. 5]
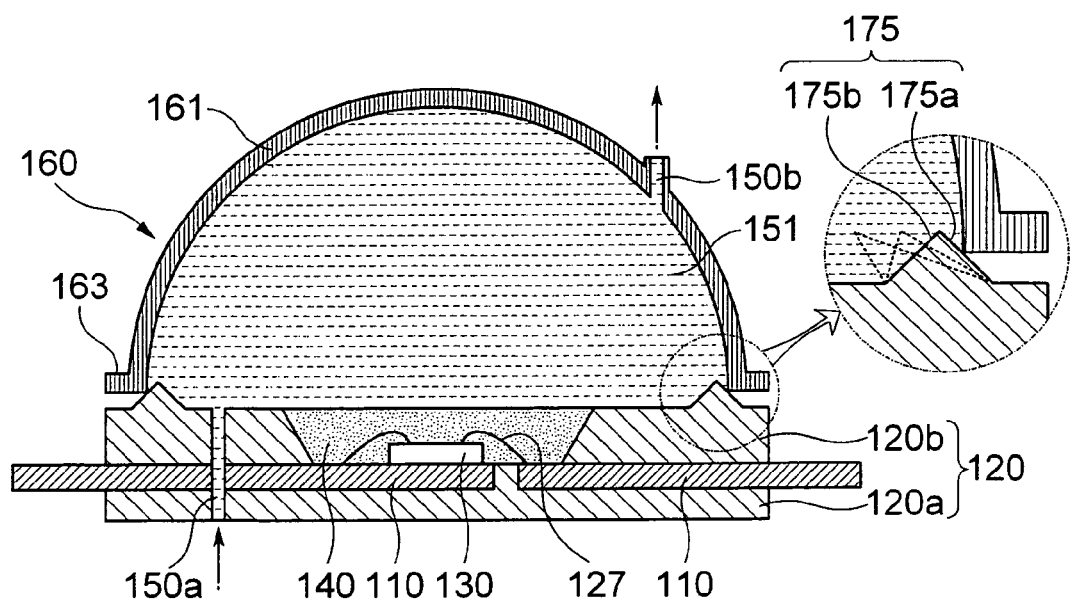

MOLD FOR FORMING MOLDING MEMBER AND METHOD OF MANUFACTURING LED PACKAGE USING THE SAME

CROSS-REFERENCE TO RELATED APPLICATIONS

This application claims the benefit of Korean Patent Application No. 10-2007-0135476 filed with the Korea Intellectual Property Office on Dec. 21, 2007, the disclosure of which is incorporated herein by reference.

BACKGROUND OF THE INVENTION

1. Field of the Invention

The present invention relates to a mold for forming a molding member and a method of manufacturing a light emitting diode (LED) package using the same.

2. Description of the Related Art

LEDs are semiconductor elements which convert electric energy into light energy, and are composed of compound semiconductor which emits light with a specific wavelength depending on energy bandgap. Further, LEDs are used in various fields such as optical communication and display.

LEDs are provided in a package type depending on the use purpose and requested shape thereof. In general, an LED package is manufactured by the following method. First, an LED chip is mounted on a substrate having an electrode pattern formed thereon or a lead frame, and a terminal of the LED chip is electrically connected to the electrode pattern (or lead). Then, a molding member is formed on the LED chip by using epoxy, silicon, or a combination thereof, and a convex lens is attached to the molding member. Then, the LED package is completed.

The lens is formed to increase light emission efficiency within a constant orientation angle. Depending on the shape of the lens, the propagating path of light can be differently set.

FIGS. 1A to 1D are process diagrams briefly showing a conventional method of manufacturing an LED package. First, as shown in FIG. 1A, a package substrate 13 having an LED chip 11 mounted thereon is prepared, and a molding member 16 surrounding the LED chip 11 is formed.

The package substrate 13 has a lead frame 15 inserted therein, and the LED chip 11 is mounted on the lead frame 15, exposed through a groove formed on the top surface of the package substrate 13, through an adhesive.

Further, an electrode pattern (not shown) of the LED chip 11 is connected to the lead frame 15 through a wiring process, and transparent resin is injected into the groove and is then solidified to form the molding member 16.

As described above, the LED chip 11 is mounted on the package substrate 13, and the molding member 16 is formed on the LED chip 16. Then, as shown in FIG. 1B, an adhesive for attaching a lens is coated on the surface of the molding member 16.

Continuously, as shown in FIG. 1C, a lens 19 which is previously manufactured by casting or the like is bonded on the adhesive 17, and the adhesive 17 is then cured by a curing process. Accordingly, as shown in FIG. 1D, the lens 19 is fixed on the molding member 16.

In the conventional method, since the lens is formed on the molding member by the process of attaching the lens, a coupling force between the lens and the package substrate is so weak that they can be easily separated from each other. Further, the lens is separately formed. Therefore, the manufacturing process becomes complicated.

SUMMARY OF THE INVENTION

An advantage of the present invention is that it provides a method of manufacturing an LED package, in which a molding member with a convex lens shape is formed on a package substrate by injecting resin into a mold such that the manufacturing process can be simplified. In the method, the contact surface between the package substrate and the mold is minimized to thereby prevent resin from leaking and bubbles from being generated.

Additional aspects and advantages of the present general inventive concept will be set forth in part in the description which follows and, in part, will be obvious from the description, or may be learned by practice of the general inventive concept.

According to an aspect of the invention, a method of manufacturing a light emitting diode (LED) package comprises the steps of: preparing a package substrate having an LED chip mounted thereon; preparing a mold which has a convex portion, a plane portion extending outward from the convex portion, and a projecting portion formed on the lower surface of the plane portion, the projecting portion having a sharp end; engaging the mold with the package substrate such that the projecting portion is contacted with the surface of the package substrate; and filling transparent resin into the convex portion.

In the preparing of the package substrate, a transparent-resin inlet or air discharge port passing through the package substrate may be formed. In preparing of the mold, a transparent-resin inlet or air discharge port passing through the convex portion may be formed.

Alternately, a transparent-resin inlet and an air discharge port passing through the package substrate may be formed, or a transparent-resin inlet and an air discharge port passing through the convex portion may be formed.

According to another aspect of the invention, a method of manufacturing an LED package comprises the steps of: preparing a package substrate having an LED chip mounted thereon; forming a projecting portion which projects from the surface of the package substrate and has an outer surface inclined toward the inside; preparing a mold which has a convex portion and a plane portion extending outward from the convex portion; engaging the mold with the package substrate such that the mold is contacted with the outer surface of the projecting portion; and filling transparent resin into the convex portion.

In the preparing of the package substrate, a transparent-resin inlet or air discharge port passing through the package substrate may be formed. In the preparing of the mold, a transparent-resin inlet or air discharge port passing through the convex portion may be formed.

Alternately, a transparent-resin inlet and an air discharge port passing through the package substrate may be formed, or a transparent-resin inlet and an air discharge port passing through the convex portion may be formed.

According to a further aspect of the invention, a mold for forming a molding member on a package substrate having an LED chip mounted thereon comprises a convex portion; a plane portion that extends from the convex portion to form a plane surface; and a projecting portion that projects from the lower surface of the plane portion and of which the end is sharpened.

The convex portion may have a through-hole passing through the convex portion. In this case, the convex portion may have first and second through holes.

The projecting portion may have first and second surfaces, of which at least one is formed of an inclined surface. In this case, the first surface forms the outer surface of the projecting portion, and the second surface forms the inner surface of the projecting portion, the second surface extending vertically from the plane portion. Alternately, the first surface forms the outer surface of the projecting portion, and the second surface forms the inner surface of the projecting portion, the first surface extending vertically from the plane portion.

The first and second surfaces may be formed of inclined surfaces of which the ends meet each other.

According to a still further aspect of the invention, a method of manufacturing an LED package comprises the steps of: preparing a package substrate having an LED chip mounted thereon; preparing a mold which has a convex portion and a plane portion; engaging the mold with the package substrate; and filling transparent resin into the convex portion such that a hemispheric molding member is formed on the LED chip. Any one of the mold and the package substrate has a projecting portion with a sharp end.

The preparing of the package substrate may include the step of: forming a projecting portion which projects from the surface of the package substrate and has an outer inclined surface to be contacted with the mold.

The preparing of the mold may include the step of: forming a projecting portion which projects from the lower surface of the plane portion and has first and second surfaces of which the ends meet each other.

Any one of the first and second surfaces may be formed of an inclined surface. The first surface forms the outer surface of the projecting portion, and the second surface forms the inner surface of the projecting portion, the second surface extending vertically from the plane portion. Alternately, the first surface forms the outer surface of the projecting portion, and the second surface forms the inner surface of the projecting portion, the first surface extending vertically from the plane portion.

The first and second surfaces may be formed of inclined surfaces of which the ends meet each other.

The method may further include the step of separating the mold from the molding member.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 1A to 1D are process diagrams briefly showing a conventional method of manufacturing an LED package;

FIGS. 2A to 2C are process diagrams for explaining a method of manufacturing a package according to an embodiment of the invention;

FIG. 3 is a diagram showing an example of an LED package substrate according to the invention;

FIGS. 4A and 4B are diagrams of a mold for forming a molding member according to an embodiment of the invention; and FIG. 5 is a cross-sectional view of a mold for forming a molding member according to another embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a mold for forming a molding member of an LED package and a method of manufacturing a package using the same according to the present invention will be described in detail with reference to the accompanying drawings.

FIGS. 2A to 2C are process diagrams for explaining a method of manufacturing a package according to an embodiment of the invention. FIGS. 4A and 4B are diagrams of a mold for forming a molding member according to an embodiment of the invention.

As shown in FIG. 2A, a cup-shaped LED package substrate 120 is prepared, which has a groove 145 formed therein and at least one lead frame 110 provided on the bottom surface of the groove 145. The inner side wall of the groove 145 may be formed with a reflecting surface which is inclined upward.

In FIG. 2A, it is exemplified that the LED package substrate 120 is composed of a lower substrate 120a having the lead frame 110 and an upper substrate 120b having the groove 145. Without being limited thereto, however, the LED package substrate may be another package substrate with a cup structure for chip mounting.

Subsequently, an LED chip 130 is mounted on the bottom surface of the groove 145, and a terminal (not shown) of the LED chip 130 is electrically connected to the lead frame 110 through a wire 127. In this case, the terminal may be connected by a flip-chip method.

The LED chip 130 may include a submount substrate and an LED chip mounted on the top surface of the submount substrate. Further, the LED chip 130 may be fixed to the top surface of the lead frame 110 through an adhesive such as Ag resin or eutectic solder.

The LED chip 130 includes at least one or more LEDs which generate blue, red, green, and ultraviolet (UV) wavelengths. For example, the LED chip 130 may be composed of only a blue LED or blue and red LEDs.

However, the present invention is not limited to such examples. The LED chip 130 may be composed of another single LED or other LEDs, if they generate blue, red, green, and UV wavelengths.

Next, transparent liquid resin mixed with phosphor materials is filled in the groove 145 of the package structure having the LED chip 130 mounted thereon, and is then cured to form a phosphor layer 140.

At this time, the transparent resin may be input into the groove 145 through a dispensing process or the like and is formed of any one of epoxy, silicon, strained silicon, urethane resin, oxetane resin, acrylic resin, polycarbonate, and polyimide.

The phosphor layer 140, which is formed by mixing resin with phosphor materials, includes phosphor materials which convert a wavelength into any one of yellow, red, and green. The phosphor materials can be determined depending on the light emission wavelength of the LED chip 130.

That is, phosphor materials which can convert light emitted from the LED chip 130 to implement white light are used. For example, when the LED chip 130 is composed of a blue LED, yellow phosphor materials are used as the phosphor materials.

In the invention, however, the phosphor layer 140 is not an essential component, but may be omitted.

As described above, after the package substrate 120 having the LED chip 130 mounted thereon is prepared, a first through-hole 150a passing through the package substrate 120 and the lead frame 110 is formed.

The first through-hole 150a may be used as a transparent resin inlet or air discharge port. As shown in FIG. 3, two through-holes 150 may be formed. That is, the first and second through-holes 150a and 150b may be formed so as to be used as a transparent resin inlet and an air discharge port, respectively.

Continuously, as shown in FIG. 2B, a mold 160 for forming a molding member is engaged with the surface of the package substrate 120 having the first through-hole 150a provided therein, and the transparent resin 151 is injected into a space between the package substrate 120 and the mold 160. The transparent resin 151 may be injected by an injector such as a dispenser or the like and is formed of any one of epoxy, silicon, strained silicon, urethane resin, oxetane resin, acrylic resin, polycarbonate, and polyimide.

The mold 160 includes a convex portion 161, a plane portion 163 extending outward from the convex portion 161, and a projecting portion 165 formed on the lower surface of the plane portion 164. The projecting portion 165 has an inclined surface.

The convex portion 161 defines a space between the package substrate 120 and the mold 160. That is, the space is formed by the convex portion 161 of the mold 160.

Meanwhile, a second through-hole 150b is formed in the convex portion 161 of the mold 160. The second through-hole 150b may be used as a transparent resin inlet or air discharge port.

That is, as the transparent resin is injected into the convex portion 161 through the first through-hole 150a of the package substrate 120, the air within the convex portion 161 is discharged to the outside through the second through-hole 150b provided in the convex portion 161.

On the contrary, the transparent resin may be injected through the second through-hole 150b, and the air may be discharged through the first through-hole 150a.

Meanwhile, as shown in FIG. 3, when the first and second through-holes 150a and 150b are formed in the package substrate 120, the transparent resin is injected through the first through-hole 150a, and the air is discharged through the second through-hole 150b. Therefore, the mold 160 does not need to have a through-hole formed therein.

Alternately, when both of the first and second through-holes 150a and 150b are formed in the convex portion 161 of the mold 160, the package substrate 120 may not have a through-hole.

When the injecting of the transparent resin 151 through the first or second through-hole 150a or 150b is completed in such a manner that the transparent resin 151 is completely filled in the convex portion 161, the package structure is moved to a high-temperature chamber to cure the transparent resin.

In such a process that the transparent resin is injected and cured, the transparent resin 151 filled in the convex portion 161 may leak to the outside such that bubbles are generated in the convex portion 161.

To solve this problem, the package substrate 120 and the mold 160 are engaged in such a manner that they come in line contact with each other.

For example, as shown in FIG. 2B, the projecting portion 165 having an inclined surface is provided on the plane portion 163 of the mold 160 contacted with the package substrate 120. In this case, the end of the projecting portion 165 is sharpened in such a manner that the contact surface between the package substrate 120 and the mold 160 is minimized.

As shown in FIGS. 4A and 4B, the projecting portion 165 is formed to project from the plane portion 163 and has first and second surfaces 165a and 165b. At least one of the first and second surfaces 165a and 165b is formed of an inclined surface such that the end of the projecting portion 165 has a sharp end.

That is, both of the first and second surfaces 165a and 165b are formed of inclined surfaces, or one of the first and second surfaces 165a and 165b is formed of an inclined surface. In this case, since the ends of the first and second surfaces 165a and 165b meet each other, the end of the projecting portion 165 has a sharp shape.

As shown in an expanded portion of FIG. 2B, when it is assumed that the first surface 165a is set to an outer surface and the second surface 165b is set to an inner surface, the first surface 165a may be formed of an inclined surface, and the second surface 165b may be formed to extend vertically from the plane portion 163. Alternately, the second surface 165b may be formed of an inclined surface, and the first surface 165a may be formed to extend vertically from the plane portion 163.

As described above, the projecting portion 165 projecting from the plane portion 163 is contacted with the package substrate 120. In this case, since the end of the projecting portion 165 is sharpened, the projecting portion 165 comes in line contact with the package substrate 120.

In such a case, when the mold 160 comes in line contact with the package substrate 120, it is possible to enhance the airtightness of the convex portion 161 during a clamping process for engaging the mold 160 and the package substrate 120.

That is, since pressure applied to the mold 160 during the clamping process is all concentrated on the end of the projecting portion 165, it is possible to secure sufficient airtightness such that the transparent resin does not leak, even though low pressure is applied.

Meanwhile, high pressure may be applied to secure the airtightness within the convex portion 161. However, when high pressure is applied, the lead frame may be deformed.

Therefore, proper pressure is applied to secure the airtightness within the convex portion 161 without the deformation of the lead frame 110, thereby preventing the transparent resin from leaking.

Continuously, when the curing process of the transparent resin 151 is completed, a molding member 152 with a lens shape is formed by separating the mold 160 from the molding member 152, as shown in FIG. 2C.

When the molding member is formed through the above-described process, a separate lens does not need to be prepared, and a process for attaching a lens to the package substrate does not need to be performed. Therefore, the manufacturing process is simplified.

Further, when the molding member is formed, the projecting portion with a sharp end is formed on the surface of the package substrate contacted with the mold such that the contact surface between the package substrate and the mold is minimized. Then, since pressure is concentrated on the end of the projecting portion, it is possible to secure the airtightness of the convex portion without the deformation of the lead frame.

Therefore, since the transparent resin is prevented from leaking such that bubbles are not generated, it is possible to further enhance light efficiency.

In this embodiment, in order to the contact surface between the package substrate and the mold during the clamping process, the projecting portion with a sharp end is formed on the lower surface of the plane portion contacted with the package substrate. However, instead of the projecting portion formed on the plane portion, a projecting portion with a sharp end may be formed on the surface of the package substrate.

That is, a projecting portion with a sharp end is provided on the surface of the package substrate, which is to be contacted with the mold, such that part of the projecting portion is included in the convex portion. Then, the inclined surface of the projecting portion comes in line contact with the mold.

FIG. 5 is a cross-sectional view of a mold for forming a molding member according to another embodiment of the invention, showing a state where a projecting portion is formed on the surface of the package substrate such that the package substrate comes in line contact with the mold.

As shown in FIG. 5, the package substrate 120 according to this embodiment includes a projecting portion 175 formed on the surface thereof, the projecting portion 175 having first and second surfaces 175a and 175b of which the ends meet each other.

At least one of the first and second surfaces 175a and 175b is formed of an inclined surface, and the end of the projecting portion 175 has a sharp shape.

That is, both of the first and second surfaces 175a and 175b are formed of inclined surfaces, or only one of the first and second surfaces 175a and 175b is formed of an inclined surface. In this case, since the ends of the first and second surfaces 175a and 175b meet each other, the end of the projecting portion 175 has a sharp shape. At this time, the outer surface of the projecting portion 175, that is, the first surface 175a should be formed of an inclined surface, in order for line contact with the mold 160. In particular, the first surface 175a should be inclined toward the side where the LED chip is mounted.

When the clamping process is performed, part of the projecting portion 175 projecting from the surface of the package substrate 120 is included in the convex portion 161 of the mold 160, and the first surface 175a comes in line contact with the mold 160.

As described above, the mold having the dome-shaped or hemispheric convex portion is prepared and then engaged with the package substrate such that a space is formed in the convex portion. Then, transparent resin is injected into the space and is cured in such a manner that a dome-shaped or hemispheric molding member is formed on the surface of the package substrate.

In this embodiment, the process of attaching a lens to a molding member may be omitted. Therefore, the manufacturing process can be simplified.

Further, since the projecting portion with a sharp end is provided, the contact surface between the mold and the package substrate is minimized when the mold and the package substrate are engaged with each other. Then, the transparent resin is prevented from leaking, so that bubbles are not generated, which makes it possible to enhance light efficiency.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a light emitting diode (LED) package, comprising:
   preparing a package substrate having an LED chip mounted thereon;
   preparing a mold which has a convex portion, a plane portion extending outward from the convex portion, and a projecting portion formed on the lower surface of the plane portion, the projecting portion having a sharp end;
   engaging the mold with the package substrate such that the sharp end of the projecting portion is in contact with an upper surface of the package substrate; and
   filling transparent resin into the convex portion,
   the package substrate and the mold being engaged in such a manner that the package substrate and the sharp end of the projecting portion of the mold come into line contact with each other.

2. The method according to claim 1, wherein in the preparing of the package substrate, a transparent-resin inlet or air discharge port passing through the package substrate is formed.

3. The method according to claim 2, wherein in the preparing of the mold, a transparent-resin inlet or air discharge port passing through the convex portion is formed.

4. The method according to claim 1, wherein in the preparing of the package substrate, a transparent-resin inlet and an air discharge port passing through the package substrate are formed.

5. The method according to claim 1, wherein in the preparing of the mold, a transparent-resin inlet and an air discharge port passing through the convex portion are formed.

6. A method of manufacturing an LED package, comprising:
   preparing a package substrate having an LED chip mounted thereon;
   forming a projecting portion which projects from an upper surface of the package substrate and has an outer surface inclined toward the inside;
   preparing a mold which has a convex portion and a plane portion extending outward from the convex portion;
   engaging the mold with the package substrate such that the mold is contacted with the outer surface of the projecting portion; and
   filling transparent resin into the convex portion,
   the package substrate and the mold being engaged in such a manner that the projecting portion of the package substrate and the mold come into line contact with each other.

7. The method according to claim 6, wherein in the preparing of the package substrate, a transparent-resin inlet or air discharge port passing through the package substrate is formed.

8. The method according to claim 7, wherein in the preparing of the mold, a transparent-resin inlet or air discharge port passing through the convex portion is formed.

9. The method according to claim 6, wherein in the preparing of the package substrate, a transparent-resin inlet and an air discharge port passing through the package substrate are formed.

10. The method according to claim 6, wherein in the preparing of the mold, a transparent-resin inlet and an air discharge port passing through the convex portion are formed.

11. A mold for forming a molding member on a package substrate having an LED chip mounted thereon, the mold comprising:
   a convex portion;
   a plane portion that extends from the convex portion to form a plane surface; and
   a projecting portion that projects from the lower surface of the plane portion and has a sharp end,
   the sharp end of the projecting portion coming into line contact with an upper surface the package substrate.

12. The mold according to claim 11, wherein the convex portion has a through-hole passing through the convex portion.

13. The mold according to claim 11, wherein the convex portion has first and second through-holes passing through the convex portion.

14. The mold according to claim 11, wherein the projecting portion has first and second surfaces, of which at least one is formed of an inclined surface.

15. The mold according to claim 14, wherein the first surface forms the outer surface of the projecting portion, and the second surface forms the inner surface of the projecting portion, the second surface extending vertically from the plane portion.

16. The mold according to claim 14, wherein the first surface forms the outer surface of the projecting portion, and the second surface forms the inner surface of the projecting portion, the first surface extending vertically from the plane portion.

17. The mold according to claim 14, wherein the first and second surfaces are formed of inclined surfaces of which the ends meet each other.

18. A method of manufacturing an LED package, comprising:
   preparing a package substrate having an LED chip mounted thereon;
   preparing a mold which has a convex portion and a plane portion;
   engaging the mold with the package substrate; and
   filling transparent resin into the convex portion such that a hemispheric molding member is formed on the LED chip,
   any one of the mold and the package substrate having a projecting portion with a sharp end, and
   the package substrate and the mold being engaged in such a manner that the package substrate and the mold come into line contact with each other due to the sharp end of the projection portion.

19. The method according to claim 18, wherein the preparing of the package substrate includes forming a projecting portion which projects from the surface of the package substrate and has an outer inclined surface to be contacted with the mold.

20. The method according to claim 18, wherein the preparing of the mold includes forming a projecting portion which projects from the lower surface of the plane portion and has first and second surfaces of which the ends meet each other.

21. The method according to claim 20, wherein any one of the first and second surfaces is formed of an inclined surface.

22. The method according to claim 21, wherein the first surface forms the outer surface of the projecting portion, and the second surface forms the inner surface of the projecting portion, the second surface extending vertically from the plane portion.

23. The method according to claim 21, wherein the first surface forms the outer surface of the projecting portion, and the second surface forms the inner surface of the projecting portion, the first surface extending vertically from the plane portion.

24. The method according to claim 21, the first and second surfaces are formed of inclined surfaces of which the ends meet each other.

25. The method according to claim 18 further comprising:
   separating the mold from the molding member.

* * * * *